US006002150A

United States Patent [19]

Gardner et al.

[11] Patent Number: 6,002,150

[45] Date of Patent: Dec. 14, 1999

[54] COMPOUND MATERIAL T GATE STRUCTURE FOR DEVICES WITH GATE DIELECTRICS HAVING A HIGH DIELECTRIC CONSTANT

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/098,719

[22] Filed: Jun. 17, 1998

[51] Int. Cl.[6] .................... H01L 29/76

[52] U.S. Cl. .................... 257/310; 257/336; 257/344; 257/410; 257/411

[58] Field of Search .................... 257/411, 410, 257/310, 408, 344, 336

[56] References Cited

U.S. PATENT DOCUMENTS

| | | | |
|---|---|---|---|
| 5,596,214 | 1/1997 | Endo | 257/324 |
| 5,619,051 | 4/1997 | Endo | 257/316 |

*Primary Examiner*—William Mintel
*Attorney, Agent, or Firm*—Kevin L. Daffer; Conley, Rose & Tayon

[57] ABSTRACT

An integrated circuit and process for making the same is provided in which a gate electrode including a gate dielectric and a gate conductor is formed upon a semiconductor substrate. Preferably, the gate dielectric has a dielectric constant greater than the dielectric constant of silicon dioxide. In an embodiment, the gate dielectric is formed from a first compound material, and the gate conductor is formed from a second compound material different from the first compound material. Preferably, the gate dielectric is selectively etched such that a portion of the gate conductor extends beyond sidewall surfaces of the gate dielectric, forming a T-shaped gate electrode. In an embodiment, a first ion implantation is used to form lightly doped drain areas aligned with the gate dielectric sidewall surfaces using a large tilt angle implant. Source and drain implant areas are then formed self-aligned with the sidewalls of opposed sidewall spacers using a second ion implant. Alternatively, the lightly doped drain implant areas and the source/drain implant areas may be formed simultaneously using a single high-energy ion implant. A metal silicide layer may be formed across upper surfaces of the source and drain areas without the need for forming spacers adjacent the gate electrode to prevent silicide bridging.

14 Claims, 3 Drawing Sheets

112
110
132
116/124
120/126
132

COMPOUND MATERIAL T GATE STRUCTURE FOR DEVICES WITH GATE DIELECTRICS HAVING A HIGH DIELECTRIC CONSTANT

BACKGROUND OF THE INVENTION

1. Field of the Invention

This invention relates to integrated circuit fabrication and, more particularly, to forming a transistor upon a semiconductor substrate in which the gate dielectric comprises a first metal oxide having a relatively high dielectric constant and the gate conductor comprises a second metal oxide different from the first metal oxide. A transistor so formed may show increased speed and decreased leakage current compared to conventional transistors having silicon dioxide gate dielectrics.

2. Description of the Relevant Art

Fabrication of a MOSFET device is well known. Generally speaking, MOSFETs are manufactured by placing undoped polycrystalline silicon ("polysilicon") over a relatively thin layer of silicon dioxide. The polysilicon material is then patterned to form a gate conductor with source/drain regions adjacent to and on opposite sides of the gate conductor. The gate conductor and source/drain regions are subsequently implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single substrate.

Because of the increased desire to build faster and more complex integrated circuits, it has become necessary to reduce the transistor threshold voltage, $V_T$, while the transistor is in its "on" state. Several factors contribute to $V_T$, one of which is the gate-to-substrate capacitance. The higher the gate-to-substrate capacitance, the lower the $V_T$ of a transistor. The value of this capacitance is dependent upon the thickness of the gate dielectric and the relative permittivity of the gate dielectric. Unfortunately, the relative permittivity, or dielectric constant, $\kappa$, of the gate dielectric limits the amount of gate-to-substrate capacitance that can be achieved when a transistor is in operation. Permittivity, $\epsilon$, of a material reflects the ability of the material to be polarized by an electric field. The capacitance between two layers of conductive material separated by a dielectric is directly proportional to the permittivity of the dielectric. The permittivity of a material is typically described as its permittivity normalized to the permittivity of a vacuum, $\epsilon_o$. Hence, the relative permittivity or dielectric constant of a material is defined as:

$$\kappa=\epsilon/\epsilon_o$$

Silicon dioxide is widely used as the gate dielectric material (or "gate oxide") in semiconductor devices. Since silicon dioxide has a relatively low $\kappa$ of approximately 3.7 to 3.8, the minimum value of $V_T$, and thus the transistor switching speed, must be somewhat related to capacitive coupling between the gate conductor and the substrate.

As mentioned above, the gate-to-substrate capacitance is also affected by the thickness of the gate dielectric. Conventional transistors typically include an ultra thin gate oxide to reduce the gate-to-substrate capacitance, and thereby lower $V_T$. The value of the gate-to-source voltage, $V_{GS}$, required to invert the channel underneath the gate conductor such that a given drive current, $I_D$, flows between the source and drain regions of the transistor is decreased. Equivalently, the value of $I_D$ for a given value of $V_T$ increases with decreasing gate dielectric thickness. Consequently, the switching speed (from off to on and vice versa) of the logic gates of an integrated circuit employing transistors with narrow gate dielectrics, allowing the integrated circuit to quickly transition between logic states (i.e., operate at high frequencies). In addition, thin gate dielectrics advantageously control short channel effects by permitting the gate to retain control of the channel charge.

The use of very thin silicon dioxide gate dielectrics, however, may present several potential problems. Thin silicon dioxide films may break down when subjected to an electric field. Particularly, for a gate oxide that is less than 50 angstroms thick, it is probable that when $V_{GS}$ is equivalent to only 3 V, electrons can pass through the gate oxide by what is known as the quantum mechanical tunneling effect. In this manner, a tunneling current may undesirably form between the semiconductor substrate and the gate conductor, adversely affecting the operability of the device. It is postulated that these electrons may become entrapped within the gate oxide by, e.g., dangling bonds. As a result, a net negative charge density may form in the gate oxide. As the trapped charge accumulates with time, $V_T$ may shift from its design specification. Breakdown of the gate oxide may also occur at even lower values of $V_{GS}$, as a result of defects in the gate oxide. Because it is at present difficult to grow very thin gate dielectric oxides precisely and uniformly across a semiconductor substrate and from wafer to wafer, such defects are unfortunately prevalent in relatively thin gate oxides. For example, a thin gate oxide often contains pinholes and/or localized voids due to unevenness at which the oxide grows on a less than perfect silicon lattice. The gate oxide must also be resistant to breakdown and hot-carrier damage. Low breakdown voltages also correlate with high defect density near the surface of the substrate. Further, in p-channel devices, the gate oxide needs to be resistant to penetration by boron at the processing temperatures used after gate doping.

It would therefore be desirable to develop a technique for fabricating a transistor with reduced gate-to-substrate capacitance that is substantially resistant to gate dielectric breakdown. Fabrication of a relatively thin gate oxide interposed between the gate and the substrate must be avoided. A transistor with the immediately preceding advantages must also switch on and off quickly, thereby providing for high frequency operation of an integrated circuit. Further, formation of a tunneling current between the gate dielectric and the gate conductor of the resulting transistor would be less likely. The possibility of electrons becoming trapped within the gate dielectric would also be reduced. The transistor would thus be substantially resistant to threshold skews from the desired value of $V_T$.

SUMMARY OF THE INVENTION

The problems outlined above are in large part solved by the technique hereof for fabricating a transistor in which the gate dielectric includes a material having a relatively high dielectric constant, $\kappa$. The gate-to-substrate capacitance, being directly proportional to $\kappa$, is thus reduced, causing a decrease in the transistor threshold voltage, $V_T$. As a result, an integrated circuit employing such transistors can more quickly transition between logic states. Further, the reduction of the gate-to-substrate capacitance can be accomplished advantageously without resorting to decreasing the gate dielectric thickness. In other words, a thicker gate dielectric can be used to achieve the same $V_T$ as compared to using a silicon dioxide gate dielectric. Therefore, the probability that the gate dielectric will break down is significantly reduced. In this manner, problems such as current passing through the gate dielectric and electron entrapment within the gate dielectric are less likely to be encountered.

Frequently, the gate dielectric layer is formed directly upon a semiconductor substrate. Typically, the semiconductor substrate is single crystalline silicon. The oxygen present in the compound dielectric materials of the present invention, however, may be sufficient to oxidize underlying portions of the silicon. As such, a barrier layer is preferably formed upon the semiconductor substrate prior to formation of the gate dielectric layer to prevent oxidation of the substrate. In an embodiment, the barrier layer includes silicon nitride. Ultra-thin layers of silicon nitride may be formed using remote plasma deposition ("RPD"). For example, RPD can be used to form a monolayer of silicon nitride that is 4 angstroms thick; preferably, the silicon nitride is formed as a bilayer (i.e., a double monolayer) that is 8 angstroms thick.

In RPD, a source of nitrogen atoms is introduced into a reactor in which energy is applied to dissociate the source molecules into their component atoms. A nitrogen plasma is formed and reacted with a source of silicon to form the silicon nitride. The plasma is termed "remote" because it does not directly contact the surface of the semiconductor substrate. Rather, the silicon and nitrogen react above the substrate to form the silicon nitride, which then deposits on the substrate.

A high-κ gate dielectric layer (i.e., a layer of a dielectric material having a κ value greater than about 3.7–3.8, the κ value of silicon dioxide) is then formed upon the barrier layer. The gate dielectric material may include a compound material. For purposes of this application, a "compound material" is defined as a material including atoms of at least two different chemical species, one of which is oxygen and the other of which is a metal. Examples of high-κ gate dielectric materials include barium strontium titanate (BST), strontium bismuth tantalate (SBT), tantalum oxide ($Ta_2O_5$), and lead zirconate titanate (PZT). In a preferred embodiment, the high-κ dielectric layer includes a ferroelectric material (i.e., a material that remains polarized when an exernally applied magnetic field is removed) such as BST or SBT.

The gate dielectric layer may be formed using, for example, chemical vapor deposition (CVD) or sputtering. In an embodiment, the gate dielectric layer is formed using metal organic CVD (MOCVD), in which a heat-decomposable compound (an organometallic in the case of MOCVD, referred to as the "source reagent") is contacted with a substrate that has been heated to a temperature above the decomposition temperature of the source reagent. The source reagent decomposes to deposit the element or metal on the substrate. By using more than one source reagent and adjusting the deposition parameters, deposition of compound materials is possible. It is possible with this process to control the concentration ratio of the reactants in the reaction gases and crystallinity of the reaction product by changing the film-forming conditions, such as the flow rate of the reaction gases, gas flow mode, or substrate temperature. Control of key variables such as stoichiometry and film thickness and coating of a wide variety of substrate geometries are generally possible with MOCVD.

Further provided is the formation of a conductive gate material upon the gate dielectric material. Preferably, the conductive gate material includes a second compound material different from the first compound material of the gate dielectric layer. In an embodiment, the gate conductor includes a material such as indium tin oxide or iridium oxide. An oxygen-containing material is preferred as the conductive gate material to avoid the formation of oxygen vacancies at the interface between the conductive and dielectric materials when the dielectric material includes oxygen. The gate conductor is preferably formed by sputter deposition, such as magnetron sputtering, of sputtering, or dc sputtering. Preferably, the sputter deposition is performed at temperatures of 170° C. or less such that etch selectivity between the conductive gate material and the gate dielectric material is enhanced during a subsequent etch step.

Following formation of the conductive gate layer, a gate stack may be patterned using the well-known photolithography process. A photoresist may be deposited upon the masking layer using, e.g., chemical vapor deposition and then selectively patterned and removed from above portions of the masking material. Portions of the conductive gate material and the underlying gate dielectric material not masked by the remaining photoresist may be removed using, e.g., an anisotropic dry plasma etch to form a mask upon a gate structure. In an embodiment, portions of the barrier layer not masked by the photoresist are removed during the etch process. Alternatively, the barrier layer may be retained upon the semiconductor substrate.

Subsequently, an isotropic etch selective for the gate dielectric material may be used to remove portions of the gate dielectric adjacent sidewall surfaces of the gate stack while substantially retaining the conductive gate material. As a result, portions of the gate conductor will extend beyond the sidewalls of the gate dielectric such that a T-shaped gate structure is formed. Dopant ions may then be implanted into the semiconductor substrate to form lightly doped drain areas. In one embodiment, a large tilt angle implant may be used to implant dopant ions at an angle of 7–45° with respect to the direction perpendicular to the surface of the semiconductor substrate. The implant angle may be selected such that dopant ions are implanted in regions of the semiconductor substrate immediately adjacent the gate dielectric. Because a high-κ gate dielectric may be considerably thicker than a silicon dioxide gate dielectric, formation of lightly doped drain areas aligned with the sidewalls of the gate dielectric may be facilitated. That is, the height of the gate dielectric may be sufficient to avoid shielding of the semiconductor substrate by the overhanging portions of the gate conductor during implantation. Following formation of the lightly doped drains, a second concentration of dopant ions may be implanted into the semiconductor substrate to form source and drain implant areas laterally spaced from the gate dielectric by the overhang portions of the gate conductor. The second implant may be performed substantially perpendicular to the upper surface of the semiconductor substrate.

In an alternative embodiment, the lightly doped drain areas and the source/drain areas may be formed simultaneously. A single high-energy implant may be forwarded into the semiconductor substrate substantially perpendicular to an upper surface of the semiconductor substrate. The source/drain areas may be formed aligned with the sidewalls of the overhang portions of the gate conductor. The overhanging portions of the gate conductor may partially mask the underlying portions of the semiconductor substrate such that lightly doped drain areas are formed aligned with the sidewall surfaces of the gate dielectric at a lesser depth and a lesser concentration than the source/drain areas.

Following the ion implantation steps, the semiconductor substrate may be annealed to activate the dopants. Metal silicide layers may then be formed upon the semiconductor substrate. A refractory metal (e.g., titanium or cobalt) may be deposited across upper surfaces of the source and drain regions and the gate conductor. The semiconductor substrate may then be heated to react the metal with the source and drain regions to form silicide regions within the source and drain regions. The sheet resistivity of the silicide thereby formed is less than the corresponding sheet resistance of the non-silicided source and drain regions. Unreacted metal may then be removed from above the gate structure and the source and drain regions. The overhanging portions of the gate conductor preferably shield the lightly doped drain regions and substantially prevent deposition of refractory metal thereon. As a result, the lightly doped drain regions may be substantially free of metal silicide. Preferably, the gate dielectric is substantially free of silicon such that formation of a conductive pathway between the source and drain regions and the gate conductor due to silicide bridging is not a problem. As such, formation of spacers adjacent the gate structure prior to silicide formation may be unnecessary.

BRIEF DESCRIPTION OF THE DRAWINGS

Other objects and advantages of the invention will become apparent upon reading the following detailed description and upon reference to the accompanying drawings in which.

Figure 1:
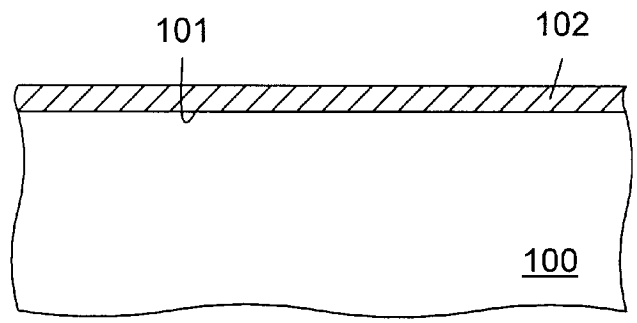
FIG. 1 is a cross-sectional view of a semiconductor topography in which a barrier layer is formed across a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIG. 1 illustrates a method for forming a transistor according to the present invention, in which a barrier layer 102 has been formed upon semiconductor substrate 100. Semiconductor substrate 100 may include single crystalline silicon. Dielectric isolation regions (not shown) may be formed within semiconductor substrate 100 arranged a spaced distance apart for dielectrically isolating ensuing active areas of the semiconductor substrate. Preferably, substrate 100 is slightly doped with n-type or p-type impurities.

Barrier layer 102 preferably acts as an oxidation buffer to prevent oxidation of regions of semiconductor substrate 100 beneath a subsequently formed gate dielectric. In an embodiment, barrier layer 102 includes silicon nitride. A silicon nitride barrier layer may be formed using remote plasma deposition, in which a source of nitrogen (e.g., nitrogen or ammonia gas) is introduced into an energy source. The energy source may produce, for example, microwave radiation, radio frequency radiation, or ultraviolet radiation. Energy supplied by the radiation may cause the nitrogen source to dissociate into its constituent atoms. Nitrogen atoms may then be selectively carried to the surface of a semiconductor wafer by an inert gas such as helium. A gas mixture of a source of silicon (e.g., silane or dichlorosilane) may then be introduced into the process chamber and to the face 101 of the semiconductor substrate. The nitrogen and the silicon-containing molecule react to produce silicon nitride, which then deposits onto the surface of the wafer. Preferably, the barrier layer of silicon nitride is between about 3–15 angstroms thick. More preferably, the barrier layer is approximately 8 angstroms thick, the thickness of a bi-layer or dual monolayer of silicon nitride atoms. The remote plasma and the supplied energy in combination allow the deposition rate of silicon nitride to be raised to an acceptable level.

Figure 2:
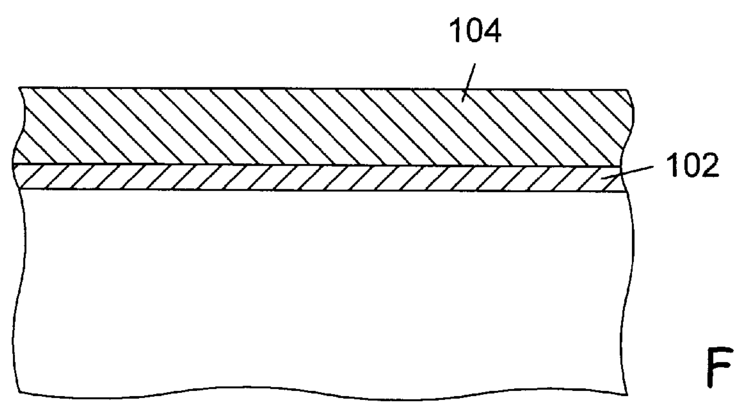
FIG. 2 is a cross-sectional view of the semiconductor topography subsequent to FIG. 1, wherein a high-κ dielectric material is formed upon the barrier layer.

Following formation of the barrier layer, a gate dielectric layer may be formed upon barrier layer 102, as depicted in FIG. 2. Dielectric layer 104 preferably has a dielectric constant κ greater than the κ value of silicon dioxide (approximately 3.7 to 3.8). Examples of high-κ dielectrics include barium strontium titanate (BST), which has a κ value of approximately 100, and strontium bismuth tantalate (SBT), which has a κ value of about 150. High-κ dielectric layer 104 may be formed using e.g., chemical vapor deposition (CVD) or spin-on deposition. In an embodiment, the gate dielectric layer is formed using metal organic CVD. The thickness of dielectric layer 104 may vary, depending somewhat on the κ value of the dielectric material and the desired threshold voltage of the ensuing transistor. For example, a 300-angstrom-thick layer of a dielectric material with a κ value of about 115 should have electrical properties approximately equivalent to the electrical properties of a silicon dioxide layer about 10 angstroms thick. Preferably, dielectric layer 104 is approximately 50–500 angstroms thick. For a gate dielectric formed from BST or SBT, the thickness of a layer of silicon dioxide having approximately equivalent electrical properties should be on the order of about 2–20 angstroms.

Figure 3:
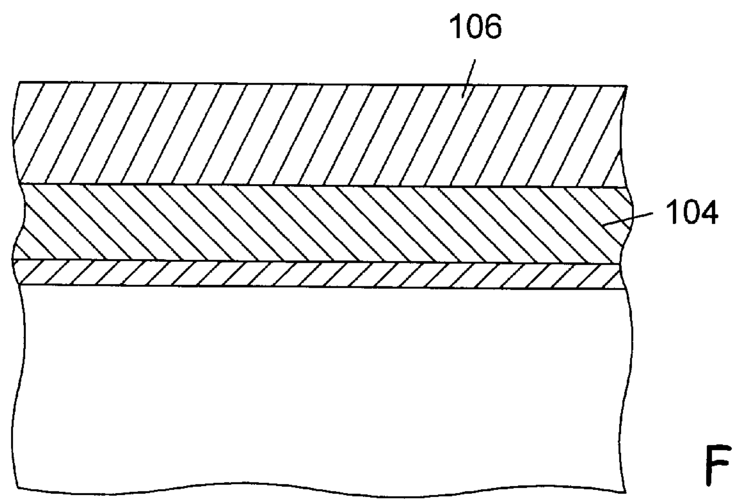
FIG. 3 is a cross-sectional view of the semiconductor topography subsequent to FIG. 2, wherein a conductive gate layer is formed upon the high-κ gate dielectric material.

After gate dielectric layer 104 is formed, a gate conductive layer may be deposited upon the gate dielectric layer, as shown in FIG. 3. Gate conductive layer 106 may be deposited using, e.g., magnetron sputtering, rf sputtering, or dc sputtering. Preferably, the sputter deposition is performed at temperatures of 170° C. or less such that etch selectivity between the conductive gate material and the gate dielectric material is enhanced during a subsequent etch step (see below). Gate conductive layer 106 preferably includes a material that is electrically compatible with gate d electric material 104. In an embodiment in which the gate dielectric material includes SBT or BST, gate conductive layer 106 preferably includes a material such as indium tin oxide (ITO) or iridium oxide. Preferably, the gate conductive layer has a thickness between about 500 and 2000 angstroms.

Metal oxides and compound materials have lower sheet resistances than many other materials used as gate conductors, and the use of metal oxides and compound materials as gate conductors may advantageously result in decreased transistor capacitance. Further, a material such as ITO is needed to prevent oxygen vacancies from occurring at the interface between the gate conductive material and the gate dielectric material. Gate electrode materials such as tungsten and tungsten nitride withdraw oxygen from dielectric materials such as BST and SBT. The resulting oxygen vacancies lead to dielectric fatigue, high leakage current from the transistor, and higher trap densities within the gate dielectric. A material such as tungsten or tungsten nitride may, however, be used as the gate conductor if the conductive gate material is formed tinder conditions of high-pressure oxidation.

Figure 4:
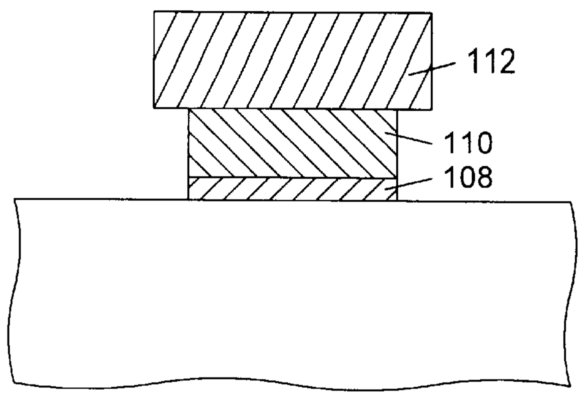
FIG. 4 is a cross-sectional view of the semiconductor topography subsequent to FIG. 3, wherein the conductive gate layer, the high-κ gate dielectric material, and the barrier layer have been patterned to form a gate structure having a gate dielectric extending beyond the sidewalls of a gate dielectric.

FIG. 4 illustrates the formation of a gate structure. A photoresist (not shown) is preferably deposited upon gate conductive material 106 using, e.g., chemical vapor deposition and then selectively patterned and removed from above portions of the conductive gate layer. Portions of gate conductive layer 106 and underlying portions of gate dielectric layer 104 not masked by the remaining photoresist may be removed by using, e.g., an anisotropic dry plasma etch to form gate conductor 112 overlying gate dielectric 110. In an embodiment depicted in FIG. 4, portions of barrier layer 102 not masked by the photoresist are simultaneously removed to form barrier pad 108.

Alternatively, barrier layer 102 may be retained upon semiconductor substrate 100 during the etch step. Subsequently, gate dielectric 110 may be narrowed using an isotropic etch selective for the gate dielectric material, such as an iron chloride or sulfur hexafluoride etch. Following etching, the photoresist is removed from upon the gate conductor.

Figure 5:
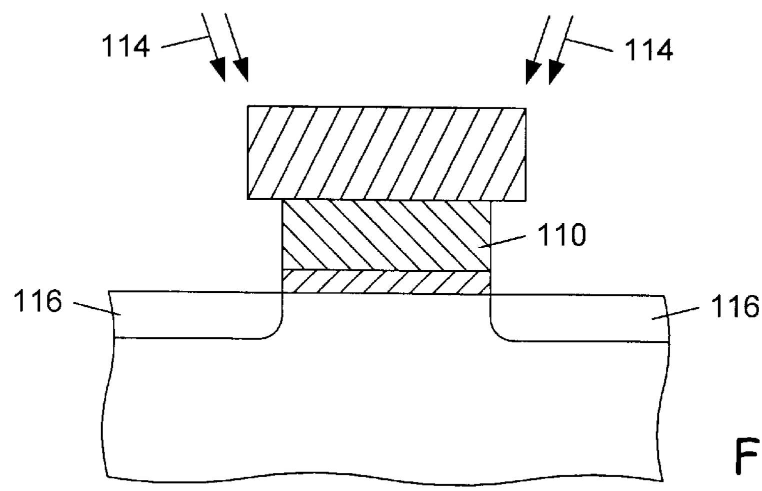
FIG. 5 is a cross-sectional view of the semiconductor topography subsequent to FIG. 4, wherein lightly doped drain implant areas have been formed using a large tilt angle implant.

Lightly doped drain implant areas 116 may then be formed by implanting dopant ions into semiconductor substrate 100 using a large tilt angle (LTA) procedure. as shown in FIG. 5. Implant 114 is preferably performed at an angle of 7° to 45° with respect to the direction perpendicular to the surface of semiconductor substrate 100. Implant 114 may include arsenic or phosphorous ions to form an NMOS transistor or boron ions to form a PMOS transistor. Preferably, the height of gate dielectric 110 and the angle of implant 114 are sufficient to allow implantation of dopant ions adjacent the sidewalls of the gate dielectric, as depicted in FIG. 5.

Figure 6:
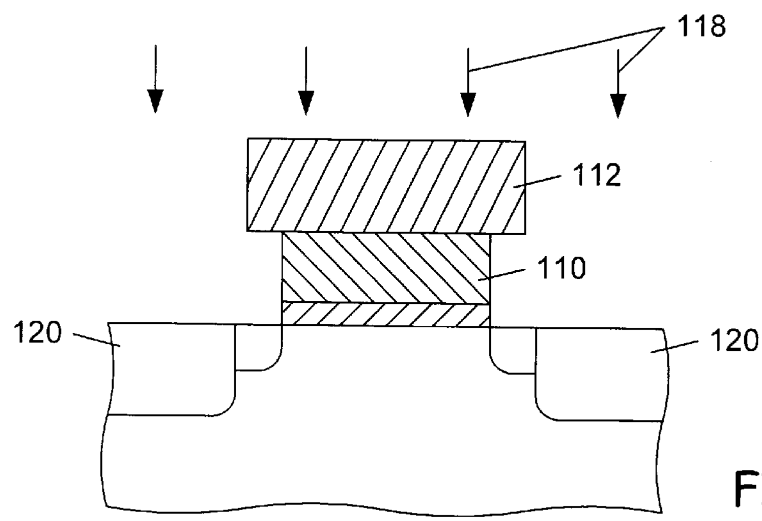
FIG. 6 is a cross-sectional view of the semiconductor topography subsequent to FIG. 5, wherein source and drain implant areas have been formed.

Source and drain implant areas 120 may then be formed by implanting dopant ions substantially perpendicular to the surface of semiconductor substrate 100, as shown in FIG. 6. Preferably, implant 118 is performed at a higher concentration and a higher energy than implant 114. Portions of gate conductor 112 extending beyond the sidewalls of gate dielectric 110 preferably serve to mask the lightly doped drain regions of semiconductor substrate 100 such that substantially no ions from source/drain implant 118 are implanted into the lightly doped drain areas 116.

Figure 7:
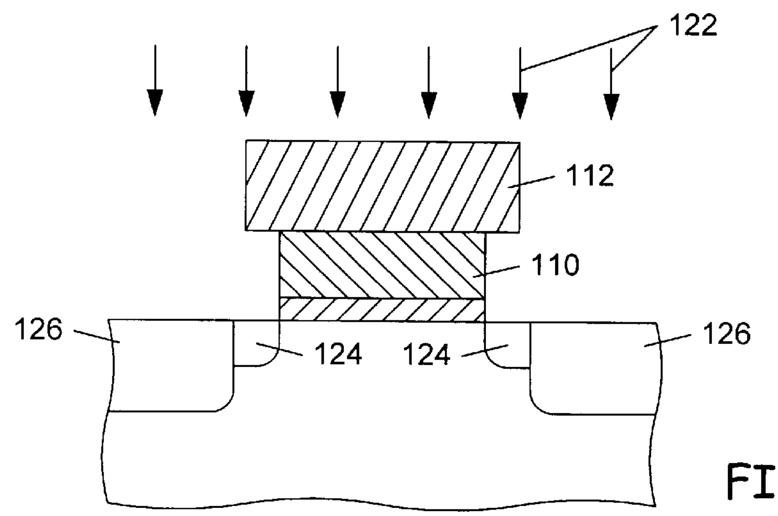
FIG. 7 is a cross-sectional view of the semiconductor topography subsequent to FIG. 4 according to an alternative processing sequence, wherein lightly doped drain implant areas are formed simultaneously with source and drain implant areas.

Alternatively, lightly doped drain implant areas and source and drain implant areas may be formed simultaneously, as depicted in FIG. 7. Implant 122 may be of sufficient energy to penetrate portions of gate conductor 112 extending beyond the sidewalls of gate dielectric 110. Lightly doped drain regions 124 will then be formed at a first depth and a first concentration. Dopant ions implanted in regions of semiconductor substrate 100 not masked by the gate conductor may form source and drain implant areas 126 having a second depth greater than the first depth and a second concentration greater than the first concentration.

Figure 8:
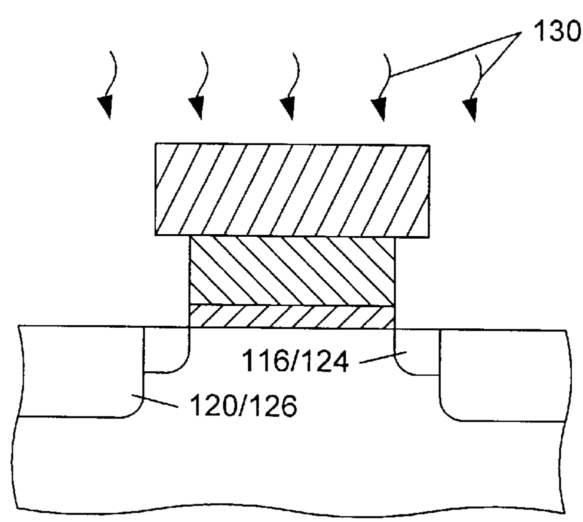
FIG. 8 is a cross-sectional view of the semiconductor topography subsequent to FIG. 6 or FIG. 7, wherein the lightly doped drain implant areas and the source and drain implant areas are thermally activated.
Figure 9:
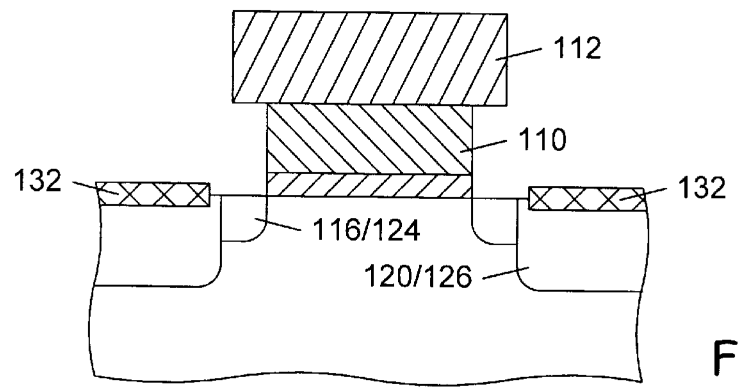
FIG. 9 is a cross-sectional view of the semiconductor topography subsequent to FIG. 8, wherein a metal silicide layer has been formed upon upper surfaces of the source and drain implant areas.

Following formation of the source and drain implant areas, the semiconductor substrate may be heated to activate the dopants in lightly doped drain areas 116/124 and source/drain areas 120/126, as shown in FIG. 8. Preferably, sufficient thermal energy 130 is applied to heat the wafer to about 800–900° C. Following activation, a metal silicide layer may be formed upon upper surface 101 of semiconductor substrate 100 in source and drain implant areas 120/126, as depicted in FIG. 9. A refractory metal (e.g., titanium or cobalt) may be formed across exposed upper surfaces of semiconductor substrate 100 and gate conductor 112. The refractory metal may be sputter deposited from a metal target such that it travels in a direction substantially perpendicular to horizontally oriented features. The deposited refractory metal may be exposed to a form of radiation capable of increasing the temperature of the refractory metal to above, e.g., 600° C. The radiation may be thermal radiation provided from a heated furnace. Alternately, the radiation may be radiant light supplied from, e.g., an arc lamp or a tungsten-halogen lamp using a technique known as rapid thermal processing ("RTP").

The use of RTP to heat the refractory metal may reduce the amount of unwanted dopant diffusion into the semiconductor topography as compared to using a high-temperature furnace. Raising the temperature of the refractory metal serves to initiate reaction between metal atoms and silicon atoms of semiconductor substrate 100. Any unreacted refractory metal that remains may be etched away using, e.g., a wet etch highly selective to the metal. The resulting metal silicide 132, shown in FIG. 9, has a relatively low resistivity and serves as a self-aligned contact region across source and drain areas 120/126. The overhanging portions of gate conductor 112 preferably shield the lightly doped drain regions 116/124 and substantially prevent deposition of refractory metal thereon. As a result, the lightly doped drain regions may be substantially free of metal silicide. Preferably, the gate dielectric is substantially free of silicon such that formation of a conductive pathway between the source and drain regions and the gate conductor due to silicide bridging does not occur. As such, formation of spacers adjacent the gate structure prior to silicide formation may be unnecessary.

It will be appreciated to those skilled in the art having the benefit of this disclosure that this invention is believed to provide a method for forming transistors of small geometries. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A semiconductor topography comprising:

a high-κ gate dielectric spaced above a semiconductor substrate by a barrier layer; and a gate conductor configured upon said high-κ gate dielectric, wherein said gate conductor extends laterally beyond sidewall surfaces of said high-κ gate dielectric.

2. The semiconductor topography of claim 1, wherein said barrier layer comprises silicon nitride.

3. The semiconductor topography of claim 2, wherein a vertical thickness of said barrier layer is between approximately 3 angstroms and approximately 15 angstroms.

4. The semiconductor topography of claim 2, wherein a vertical thickness of said barrier layer is approximately 8 angstroms.

5. The semiconductor topography of claim 1, wherein said barrier layer substantially inhibits oxidation of said semiconductor substrate underlying said barrier layer.

6. The semiconductor topography of claim 1, wherein said barrier layer substantially inhibits migration of metal ions from said high-κ dielectric into said semiconductor substrate.

7. The semiconductor topography of claim 1, wherein said high-κ gate dielectric comprises a ferroelectric material.

8. The semiconductor topography of claim 1, wherein said high-κ gate dielectric comprises a material selected from the group consisting of strontium bismuth tantalate and barium strontium titanate.

9. The semiconductor topography of claim 1, wherein a vertical thickness of said high-κ gate dielectric is between approximately 50 angstroms and 500 angstroms.

10. The semiconductor topography of claim 1, wherein said gate conductor comprises a compound material.

11. The semiconductor topography of claim 1, wherein said gate conductor comprises a material selected from the group consisting of indium tin oxide and iridium oxide.

12. The semiconductor topography of claim 1, wherein a vertical thickness of said gate conductor is between approximately 500 and 2000 angstroms.

13. The semiconductor topography of claim 1, further comprising:

lightly doped drain implant areas extending laterally beneath said gate conductor; and source and drain implant areas self-aligned with sidewall surfaces of said gate conductor.

14. The semiconductor topography of claim 13, further comprising a metal suicide layer arranged upon an upper surface of the source and drain implant areas.

* * * * *

UNITED STATES PATENT AND TRADEMARK OFFICE

CERTIFICATE OF CORRECTION

PATENT NO. : 6,002,150

DATED : December 14, 1999

INVENTOR(S) : Gardner et al.

It is certified that error appears in the above-identified patent and that said Letters Patent is hereby corrected as shown below:

In the Claims:

Claim 14, col. 10, line 23, after the phrase "comprising a metal" please delete "suicide" and substitute therefor --silicide--.

Signed and Sealed this

Thirteenth Day of June, 2000

*Attest:*

Q. TODD DICKINSON

*Attesting Officer*

*Director of Patents and Trademarks*